United States Patent [19]
Yamashita

[11] Patent Number: 5,506,903
[45] Date of Patent: Apr. 9, 1996

[54] DIGITAL MULTIPLEX TRANSMISSION SYSTEM

[75] Inventor: Masami Yamashita, Tokyo, Japan

[73] Assignee: Sony Corporation, Tokyo, Japan

[21] Appl. No.: 223,217

[22] Filed: Apr. 5, 1994

[30] Foreign Application Priority Data

Apr. 6, 1993 [JP] Japan ................................. 5-101848

[51] Int. Cl.⁶ .................................................. H04N 7/167
[52] U.S. Cl. ............................. 380/19; 380/10; 380/20; 380/49; 370/79
[58] Field of Search ........................... 380/9, 10, 21, 380/20, 48, 49, 50; 370/79, 82, 84

[56] References Cited

U.S. PATENT DOCUMENTS 4,907,233  3/1990  Deutsch et al. .
5,400,401  3/1995  Wasilewski et al. ................... 380/9

FOREIGN PATENT DOCUMENTS 2052906  4/1992  Canada .
2216753  10/1989  United Kingdom .

OTHER PUBLICATIONS

WPI Abstract Accession No: 89–306252/42, JP 1228327 A (Kojima).

Primary Examiner—David C. Cain
Attorney, Agent, or Firm—Jay H. Maioli

[57] ABSTRACT

A digital multiplex transmission system wherein the rate of convolution codes can be changed over in accordance with an object of a user without changing the transmission rate. A frame for transmitting system data, first preliminary data, second preliminary data, scramble control data, audio data, video data and Reed-Solomon codes is constructed by allocation of them such that a boundary between each adjacent region may make a vertical straight line. Data of such a frame are coded by convolution coding and then transmitted. When the transmission line is in a deteriorated condition, the rate of the convolution codes is reduced to increase the correcting faculty for the convolution codes. In contrast, when the transmission line is in a good condition, the rate of the convolution codes is increased to transmit a large amount of data.

11 Claims, 13 Drawing Sheets

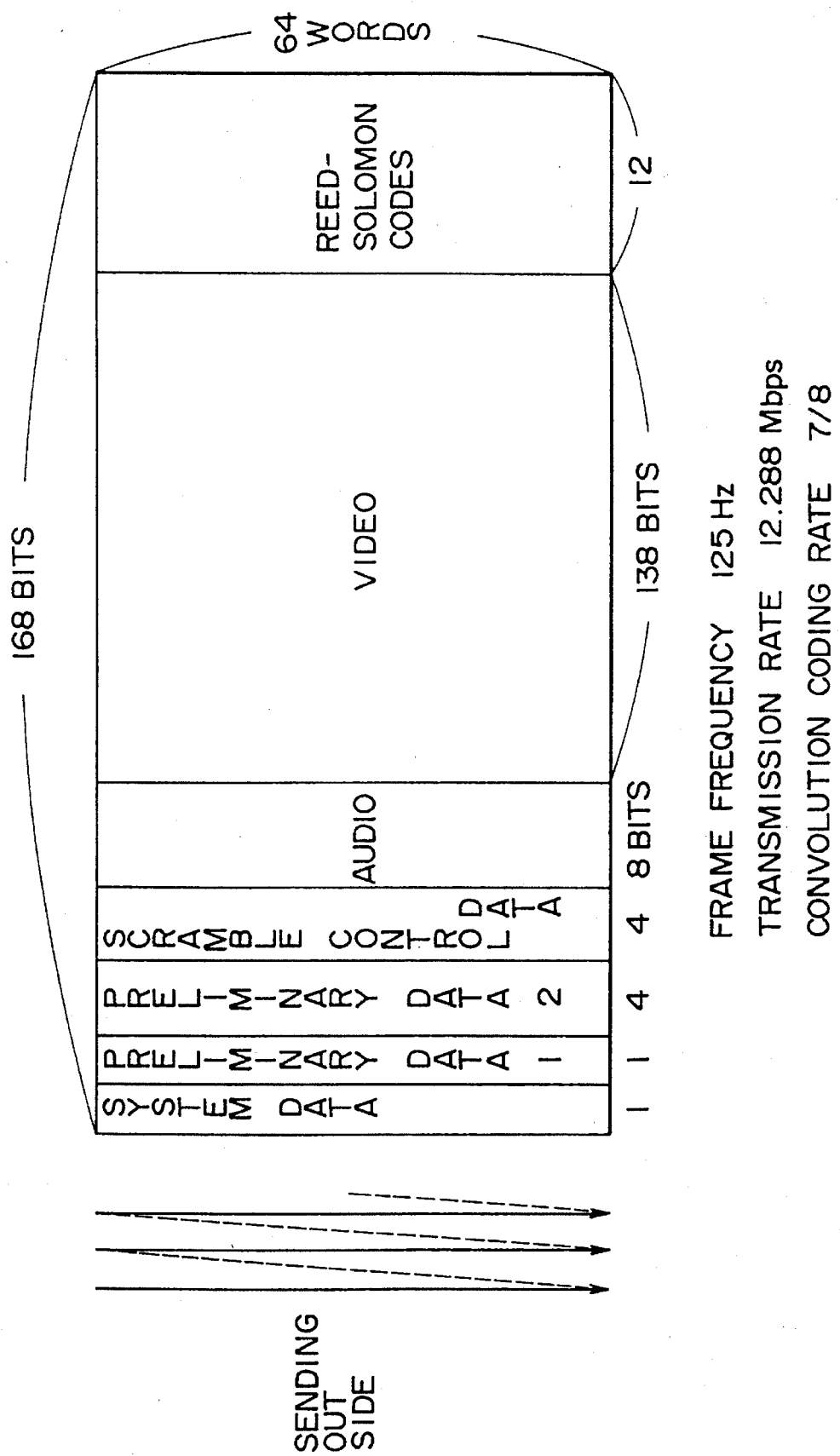

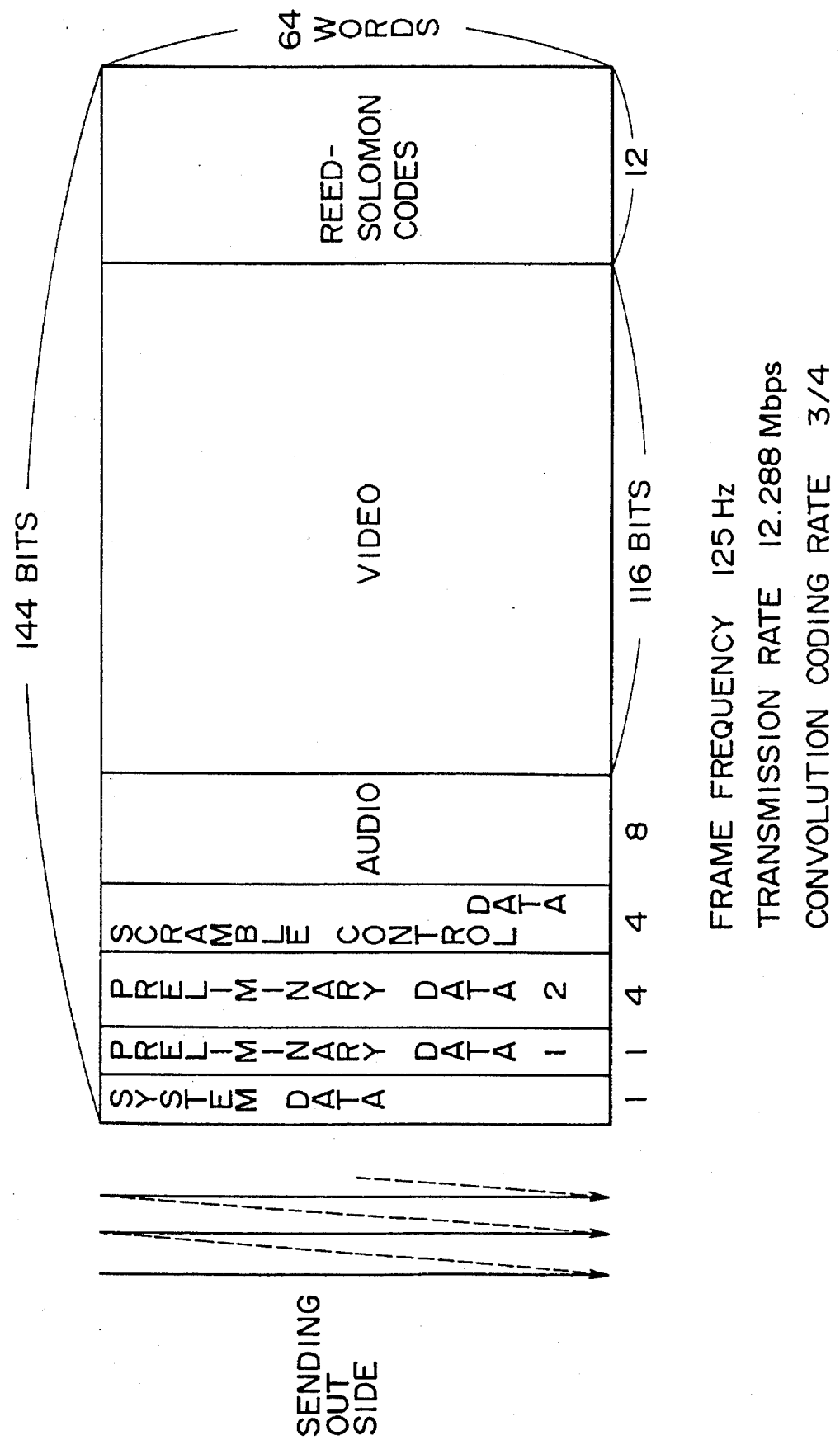

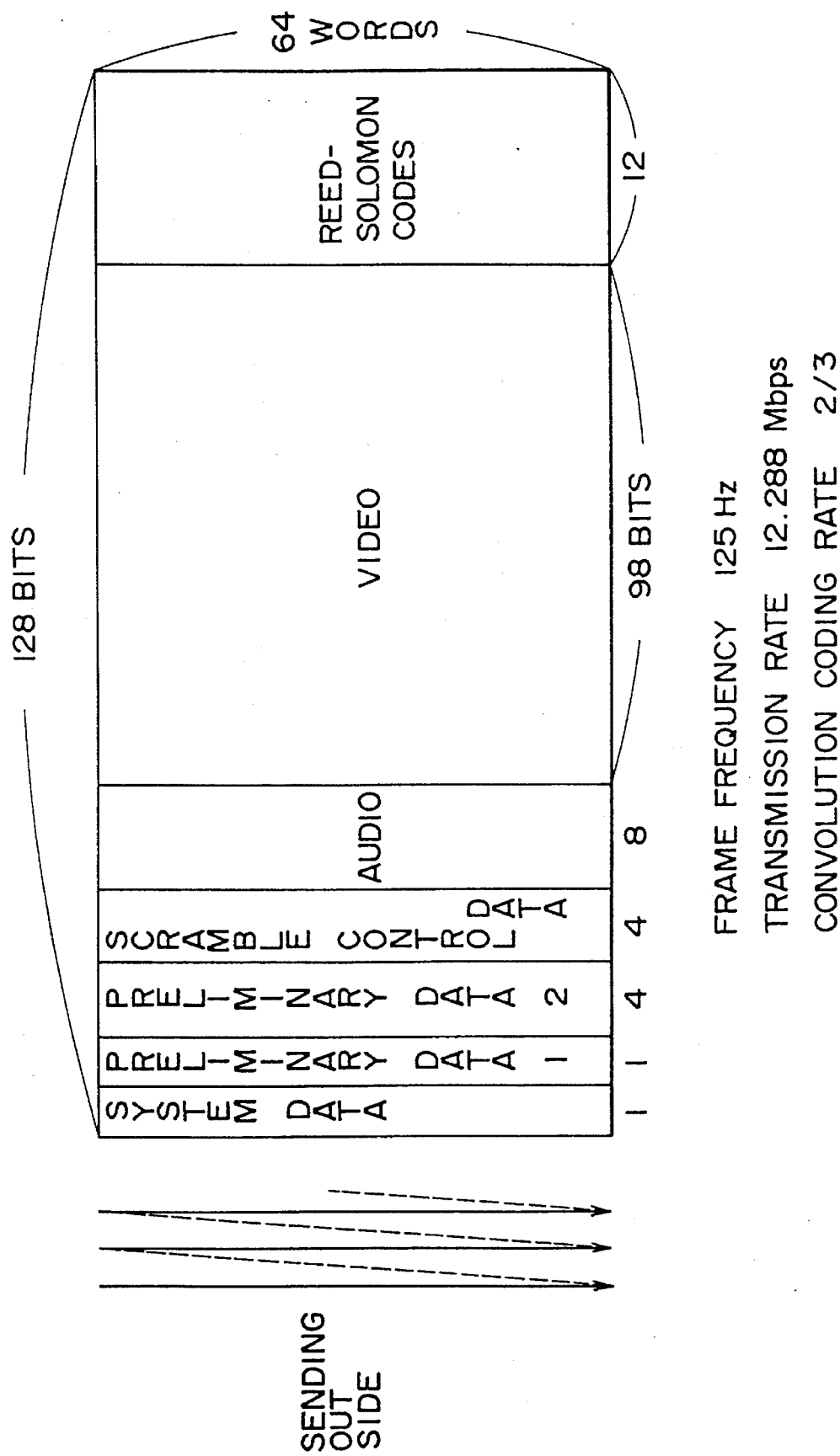

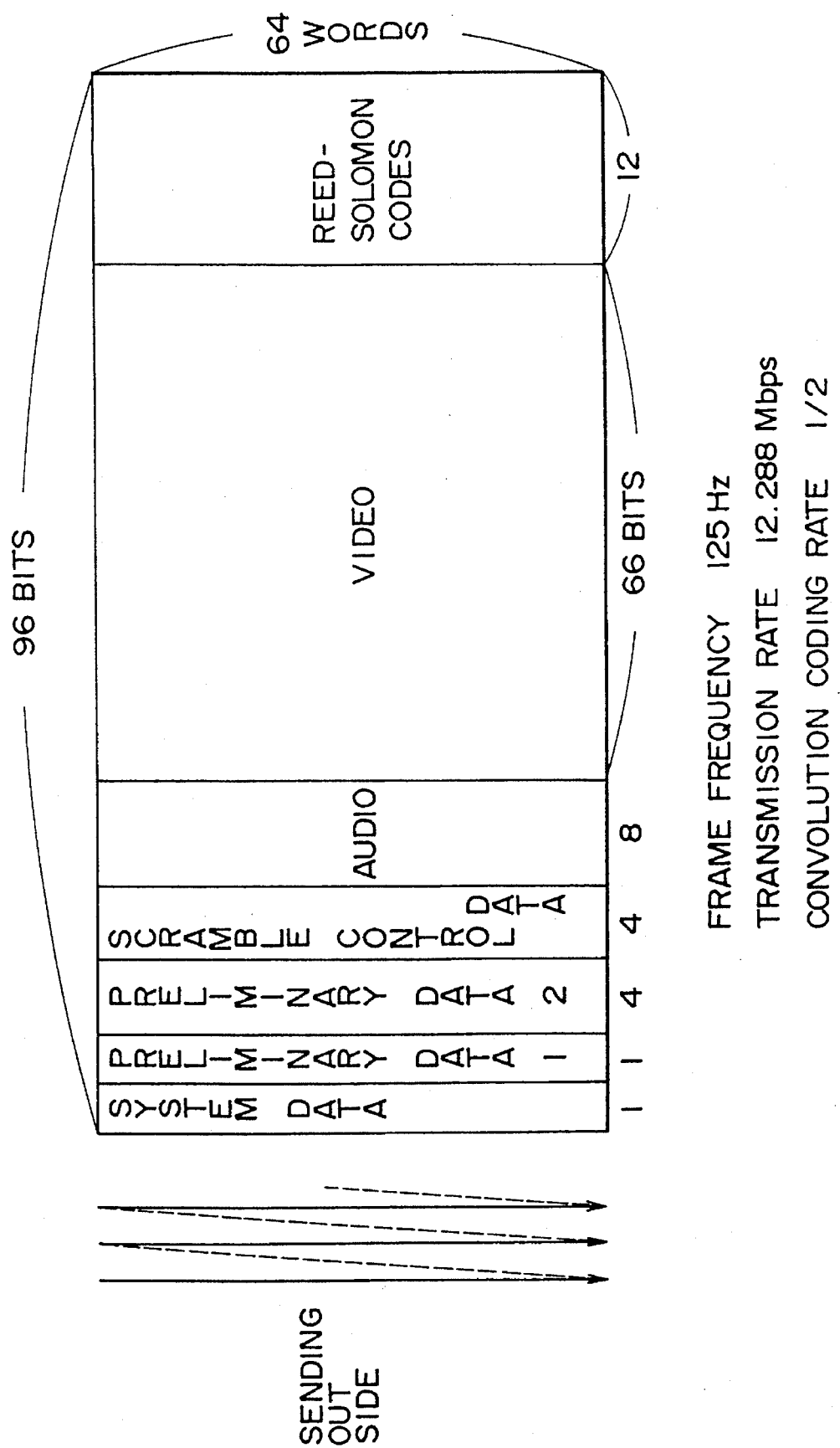

FIG. II

| TRANS-MISSION RATE [Mbps] | BAND WIDTH [MHz] | INFORMATION RATE [Mbps] | | | | | FRAME FREQUENCY [Hz] |
|---|---|---|---|---|---|---|---|
| | | R=7/8 | R=5/6 | R=3/4 | R=2/3 | R=1/2 | |
| 49.152 | 32 | 43.008 | 40.96 | 36.664 | 32.768 | 24.576 | 500 |
| 24.576 | 16 | 21.504 | 20.48 | 18.432 | 16.384 | 12.288 | 250 |
| 12.288 | 8 | 10.752 | 10.24 | 9.216 | 8.192 | 6.144 | 125 |
| 6.144 | 4 | 5.376 | 5.12 | 4.608 | 4.096 | 3.072 | 62.5 |
| FRAME HORIZONTAL SIZE [BITS] | | 168 | 160 | 144 | 128 | 96 | |
| REED-SOLOMON RATE | | 0.93 | 0.925 | 0.92 | 0.91 | 0.875 | |

DIGITAL MULTIPLEX TRANSMISSION SYSTEM

BACKGROUND OF THE INVENTION

1. Field of the Invention

This invention relates to a digital multiplex transmission system by which a signal such as an audio signal or a video signal can be transmitted fully digitally with an arbitrary redundancy selectively set in accordance with an object of a user and is suitably applied particularly to transmission which makes use of an artificial satellite.

2. Description of the Related Art

In recent years, broadcasting communications which make use of an artificial satellite have been realized. However, a communication system which allows full digital transmission has not been realized as yet except broadcasting communications for an audio signal. Transmission of digital audio data and digital data employed in television broadcasting by broadcasting communications is illustrated in FIG. 13. In particular, FIG. 13 illustrates a two-dimensional frame construction for transmission of digital audio data and digital data. Referring to FIG. 13, voices 1 to 4 are audio data which are compressed in 10 bits for each one sample; a range bit is a bit indicating a range of one bit representing a quantization bit range; data are digital data constituted from 15 bits for each one sample; and a correction code is an error correction code constituted from a 7-bit BCH code which allows correction of an error of 1 bit and detection of an error of 2 bits.

The frame shown in FIG. 13 includes 63 bits in a horizontal row and 32 bits in a vertical column so that the one frame is constituted from a total of 2,048 bits. Of the 63 bits in a horizontal row of the frame, one bit is allocated to the range bit; ten bits are allocated to one sample of each of the voices 1 to 4 so that a total of 40 bits are allocated to the voices 1 to 4; fifteen bits are allocated to one sample of the digital data; and seven bits are allocated to the error correction code.

Meanwhile, in a vertical column, digital audio data and digital data of the voices 1 to 4 for 32 samples are arranged vertically so that each vertical column includes a total of 32 bits. The error correction code is a code for correcting an error of a total of 56 bits of the range bit, the voices 1 to 4 and the digital data which are included in a horizontal row of the frame. The frame is scanned vertically as seen from FIG. 13 to effect interleaving to send out resultant data into a transmission line. The technique described above regarding satellite broadcasting is disclosed in EP 0,548,844 A2 while the technique regarding error correction is disclosed in EP 0,548,887 A2.

In such a multiplex transmission system which employs an artificial satellite as described above, the transmission output from the artificial satellite is so limited that, when the weather is bad such as rainy or when a reception antenna is small, ordinary transmission cannot be achieved and consequently a reception picture may be disturbed. In such an instance, if the redundancy is increased to strengthen the error correction codes instead of degrading the quality of the image, an image of a somewhat higher quality can be received regularly without varying the transmission rate. On the other hand, when the reception antenna is large or the weather is fine, if the redundancy is decreased to raise the quality of the picture, a superior image can be received without varying the transmission rate.

Further, when the allocated band width within a transmission band held by the satellite is changed, transmission cannot be performed without varying the transmission rate or efficient transmission cannot be performed. However, in such a conventional multiplex transmission system as described above, since the frame construction or the construction of an error correction code is fixed, there is a problem in that the quality of the image or the construction of the error correction code cannot be altered and also the transmission rate cannot be changed.

SUMMARY OF THE INVENTION

It is an object of the present invention to provide a digital multiplex transmission system wherein a multiplex frame is constructed such that the redundancy of an error correction code can be changed and the information rate principally of digital video data can be changed when the redundancy is changed so that the transmission rate may be fixed.

It is another object of the present invention to provide a digital multiplex transmission system wherein a multiplex frame is constructed so that the information rate principally of digital video data can be changed upon changing of the transmission rate.

In order to attain the objects described above, according to an aspect of the present invention, there is provided a digital multiplex transmission system, which comprises means for multiplexing at least digital audio data and digital video data and scrambling the multiplexed data with a scrambling train, means for multiplexing the scrambled data with scramble control data and system data to allocate the data on a two-dimensional frame such that a boundary between each adjacent ones of the data makes a vertical straight line, means for coding the frame in units of a block in a horizontal direction by Reed-Solomon coding to add Reed-Solomon codes to the frame, and means for adding the system data including a frame synchronizing signal to the two-dimensional frame, coding the resulted data by convolution coding to obtain digital multiplexed data and transmitting the digital multiplexed data.

With the digital multiplex transmission system, the redundancy of convolution codes or the amount of information of digital data in a frame can be set freely in accordance with an object or characteristics of the system, and consequently, the system can be built up in accordance with an object of a user. Accordingly, when a reception antenna is small or when the weather is bad, the redundancy of convolution codes can be increased to obtain a correction code of a very high error correction faculty so that digital data including much errors can be demodulated normally. On the other hand, if the redundancy of convolution codes is decreased to increase the amount of information of digital data in one frame, then the quality of the picture can be improved.

Preferably, the digital multiplexer transmission system further comprises means for changing over the transmission rate in response to a transmission band width to be used. Here, since the amount of information of digital data can be varied in accordance with a transmission band width available for transmission, the system can be built up with a higher degree of freedom in accordance with an object of a user.

According to another aspect of the present invention, there is provided a digital multiplex transmission system, which comprises means for multiplexing at least digital audio data and digital video data and scrambling the multiplexed data with a scrambling train, means for multiplexing the scrambled data with scramble control data and system data to allocate the data on a two-dimensional frame and coding the frame in units of a block in a horizontal direction by Reed-Solomon coding to add Reed-Solomon codes to the frame, means for adding the system data including a frame synchronizing signal to the two-dimensional frame, coding the resulted data by convolution coding to obtain digital multiplexed data and transmitting the digital multiplexed data, and means for allocating the system data including the frame synchronizing signal, the scramble control data, packets including the audio data and the digital data, and the Reed-Solomon codes on the two-dimensional frame such that a boundary between each adjacent ones of the data and the packets makes a vertical straight line.

Also with the digital multiplex transmission system, the redundancy of convolution codes or the amount of information of digital data in a frame can be set freely in accordance with an object or characteristic of the system, and consequently, the system can be built up in accordance with an object of a user. Accordingly, when a reception antenna is small or when the weather is bad, the redundancy of convolution codes is increased to obtain a correction code of a very high error correction faculty so that digital data including many errors can be demodulated normally. On the other hand, if the redundancy of convolution codes is decreased to increase the amount of information of digital data in one frame, then the quality of the picture can be improved. Further, since the frame is partially constituted from packets, the number of multiplex channels of data in the packets can be set freely.

The allocating means may construct the two-dimensional multiplexed frame such that the system data including the frame synchronizing signal, packets including the scramble control data as well as the audio data and the video data, and the Reed-Solomon codes are allocated on the two-dimensional frame such that a boundary between each adjacent region of the data and the packets makes a vertical straight line. Since the scramble control data are also transmitted by way of the packets, scramble control can be performed in units of a packet. Consequently, prevention of unauthorized decoding or cancellation of the scramble from a particular channel can be achieved.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 3 to 10 are diagrammatic views illustrating different frame constructions which may be employed in the digital multiplex transmission system of the present invention;

FIG. 11 is a table illustrating a corresponding relationship among the transmission rate, the information rate, the frame frequency and the horizontal size of a frame;

DETAILED DESCRIPTION OF THE PREFERRED EMBODIMENT

Figure 1:
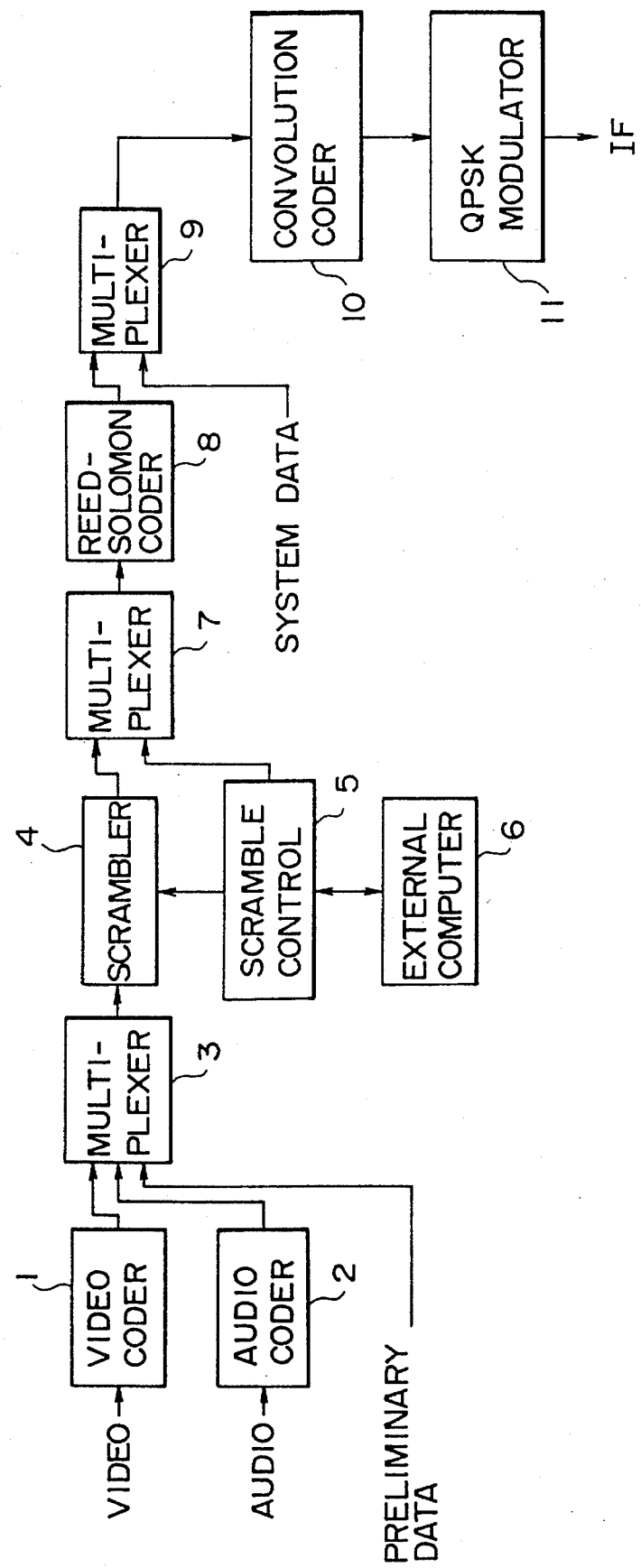
FIG. 1 is a block diagram of an encoder of a digital multiplex transmission system according to the present invention.

FIG. 1 shows an encoder of a digital multiplex transmission system according to the present invention. Referring to FIG. 1, the encoder shown includes a video coder 1 for converting a video signal into a high efficiency code, an audio coder 2 for converting an audio signal into a high frequency code, a first multiplexer 3 for multiplexing coded digital video data from the video coder 1, coded digital audio data from the audio coder 2 and digital preliminary data, a scrambler 4 for scrambling multiplexed data from the multiplexer 3 to allow conditional accessing to be performed, and a scramble controller 5 for generating and applying a scrambling train to the scrambler 4 and applying scramble key information to a second multiplexer 7.

The encoder further includes an external computer 6 for controlling the scramble controller 5 from the outside, the second multiplexer 7 for multiplexing scrambled data from the scrambler 4 and scramble key information from the scramble controller 5 to construct a two-dimensional frame which will be hereinafter described, a Reed-Solomon coder 8 for converting a code block in a horizontal direction of a two-dimensional frame into a Reed-Solomon code, a third multiplexer 9 for adding system data to a two-dimensional frame, a convolution coder 10 for coding a two-dimensional frame by convolution coding by which the redundancy can be changed, and a QPSK modulator 11 for modulating convolution coded multiplexed data from the convolution coder 10 by four phase shift keying modulation to produce an intermediate frequency signal.

Figure 3:
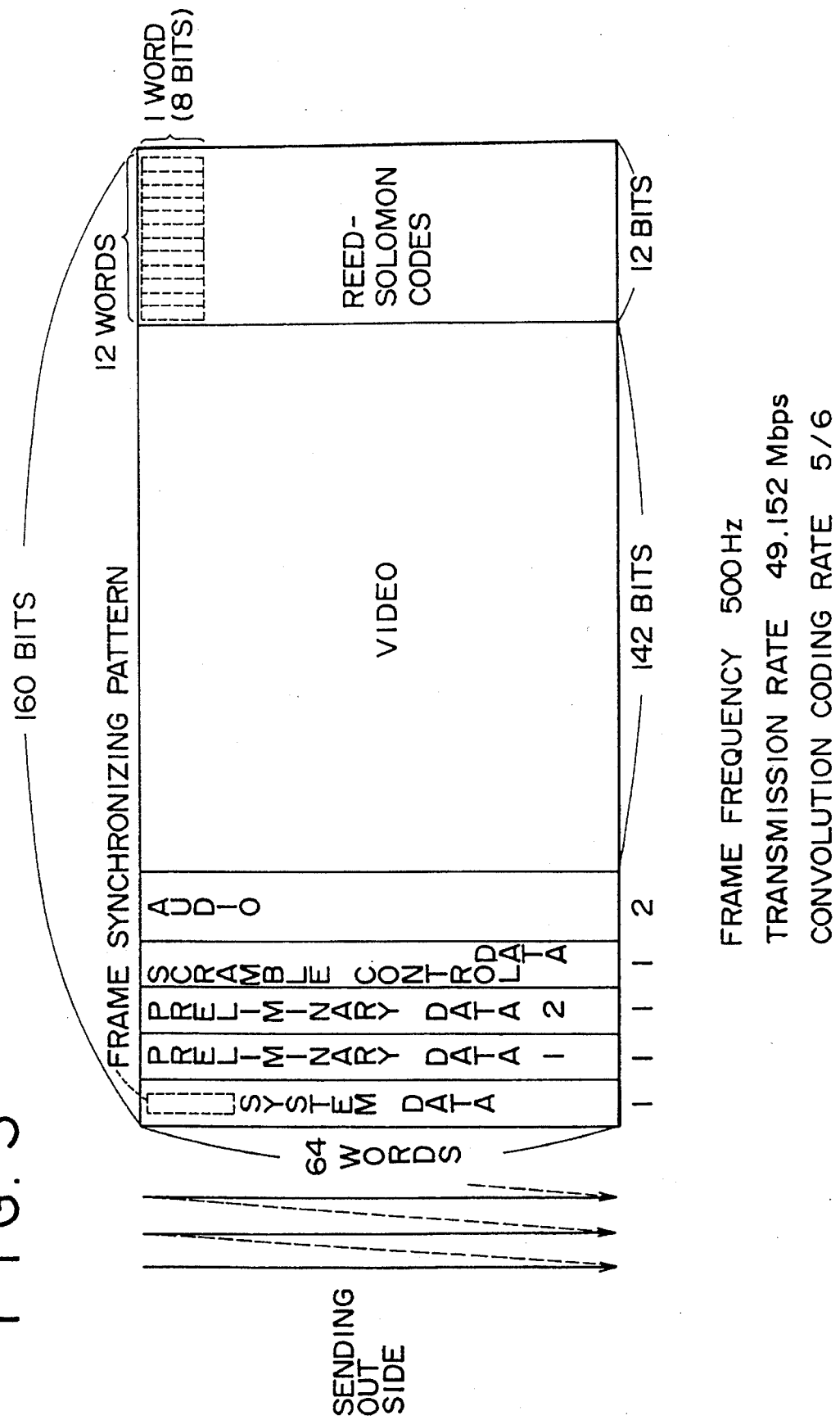

The encoder shown in FIG. 1 multiplexes data so that they may have such a two-dimensional frame construction as, for example, illustrated in FIG. 3. In particular, FIG. 3 illustrates a frame construction when convolution coding at the rate of 5/6 is performed for multiplexed data of the information rate of 40.96 Mbps so that the multiplexed data are transmitted at the transmission rate of 49,152 Mbps. The frame construction has a frame size of 160 bits in a horizontal direction and 64×8 bits in a vertical direction, and the frame frequency is 500 Hz.

Referring to FIG. 3, the first region includes 1×16 words allocated to system data representative of a construction in the frame with a frame synchronizing pattern positioned at the top. Two regions each including 1×64 words are provided next to the first region and allocated to preliminary data 1 and preliminary data 2. The two data regions can be used freely by a user. A further next region of 1×64 words is allocated to scramble control data which are information for conditional accessing such as scramble key information. A still further next region includes 2×64 words allocated to audio data, and a yet further region of 142×64 words allocated to video data is provided next to the audio data region. The last region of 12×64 words is allocated to Reed-Solomon codes of 12 words which are added so that error correction may be performed in units of a code block of a frame in a horizontal direction.

In this manner, the regions are allocated to the various data dividing the frame vertically so that the boundary between each adjacent region of the data may make a vertical straight line, and the information rates of the individual data are defined as given below:

| | |
|---|---|
| video data | 36.352 Mbps |
| audio data | 512 kbps |
| preliminary data 1 | 256 kbps |
| preliminary data 2 | 256 kbps |
| scramble control data | 256 kbps |
| system data | 256 kbps |
| Reed-Solomon codes | 3.072 Mbps |

Subsequently, operation of the encoder shown in FIG. 1 will be described with reference to FIG. 3. A video signal and an audio signal are coded by compression coding by the coders 1 and 2, respectively, so that they are converted into high efficiency coded data. The video data and the audio data converted into the high efficiency coded data are applied together with preliminary data to the first multiplexer 3, by which they are multiplexed in a time series relationship.

The thus multiplexed data are applied to the scrambler 4, by which they are scrambled to allow conditional accessing to be performed. A scrambling train is applied to the scramble 4 from the scramble control circuit 5, and the multiplexed data outputted from the first multiplexer 3 are scrambled with the scrambling train. Meanwhile, in order to allow descrambling on the reception side, scramble control data such as scramble key information are outputted from the scramble controller 5 and applied to the second multiplexer 7.

Further, in order to allow conditional accessing to be controlled from the outside, the external computer 6 is connected to the scramble controller 5. The multiplexed data scrambled by the scrambler 4 and the scramble control data are multiplexed by the second multiplexer 7 to make up a frame construction in which such regions as shown in FIG. 3 are allocated. Then, in order to allow correction of a transmission error, a Reed-Solomon code of 12 words is added to a block of 147 words in a rightward horizontal direction from the preliminary data as indicated by broken lines in FIG. 3 by the Reed-Solomon coder 8.

Further, system data are added to the top of the frame by the third multiplexer 9, thereby to obtaining a frame of the construction shown in FIG. 3. It is to be noted that the frame synchronizing pattern in the system data positioned at the top of the frame is constituted from 32 bits of, for example, 0000 0100 1001 0010 1010 1101 1100 1110, and on the reception side, the pattern is detected to establish that a frame is detected.

Further, each word includes 8 bits arranged in a vertical direction. Consequently, one code block in a horizontal direction of a frame including a Reed-Solomon code is constituted from 8×160 bits. Accordingly, the information transmission rate in this instance is 160×64×8×500=40.96 Mbps.

Subsequently, the data of the frame shown in FIG. 3 are scanned in a vertical direction from the top to the bottom as seen in FIG. 3 and sent out and applied from the multiplexer 9 to the convolution coder 10, by which they are coded by convolution coding at the rate of ⅚. This convolution coding is performed in order to provide a redundancy to multiplexed data for transmission to allow error correction, and on the reception side, the convolution coded data can be processed by error correction by decoding the same, for example, by bitervi decoding. It is to be noted that such scanning in a vertical direction to send out data of a frame is called interleaving, and if interleaving is performed, a burst error which may be produced in a transmission line will be made a dispersed short error.

Here, while the rate of the data outputted from the convolution coder 10 is the transmission rate of the encoder, the transmission rate is 40.96÷⅚=49,152 Mbps. Then, the multiplexed data convolution coded by the convolution coder 10 are applied as a modulation signal to the QPSK modulator 11, by which four phase shift keying modulation is performed to produce an intermediate frequency signal. The intermediate frequency signal obtained by such four phase shift keying modulation is applied to a transmission section not shown so that it is converted into a signal of a transmission frequency, which is transmitted, for example, from an antenna of an artificial satellite.

The digital multiplexed data transmitted in this manner are received by an antenna located, for example, on the ground and then decoded by a decoder provided in a reception section. Such decoder is shown in FIG. 2.

Figure 2:
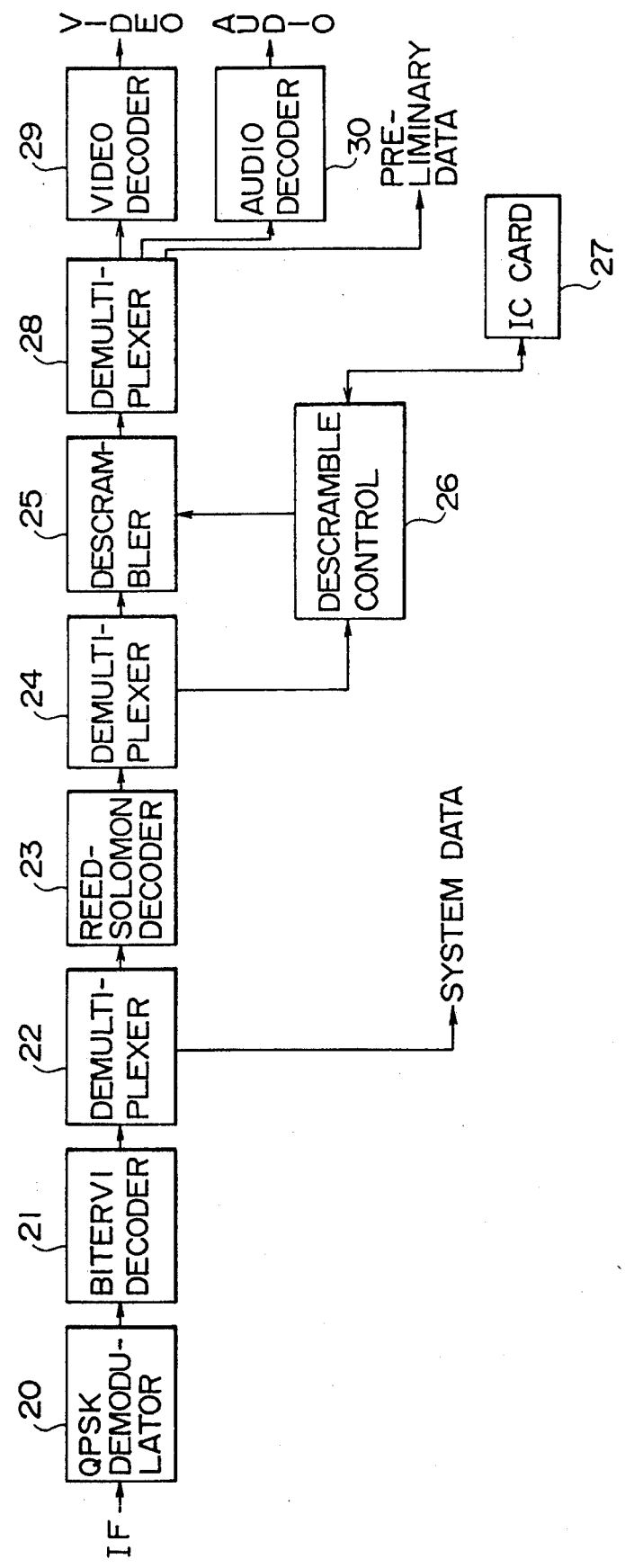
FIG. 2 is a block diagram of a decoder of the digital multiplex transmission system according to the present invention.

Referring to FIG. 2, the decoder shown includes a QPSK demodulator 20 for demodulating a received intermediate frequency signal modulated by four phase shift keying modulation by four phase shift keying demodulation, a bitervi decoder 21 for decoding convolution coded multiplexed data by bitervi decoding to effect error correction, a first demultiplexer 22 for separating system data from a deinterleaved frame, a Reed-Solomon decoder 24 for effecting error correction of data using a Reed-Solomon code added in units of a block in a horizontal direction of a deinterleaved frame, a second demultiplexer 24 for separating scramble control data, and a descrambler 25 for descrambling output data of the demultiplexer 24 using a descrambling train applied thereto from a descramble controller 26.

The descramble controller 26 generates a descrambling train from scramble control data separated by the demultiplexer 24 and applies the descrambling train to the descrambler 25. The decoder further includes an IC card reader 27 connected to the descramble controller 26 for descrambling data from the descrambler controller 26 with data stored in an IC card possessed by a user, a third demultiplexer 28 for demultiplexing descrambled multiplexed data into video data, audio data and preliminary data, a video decoder 29 for decoding video data from the demultiplexer 28 to produce a video signal, and an audio decoder 30 for decoding audio data from the demultiplexer 28 to produce an audio signal.

In the decoder shown in FIG. 2, an intermediate frequency signal IF is demodulated by four phase shift keying demodulation by the QPSK demodulator 21 and then applied to the bitervi decoder 22. The convolution coded digital data are decoded after an error thereof is corrected by the bitervi decoder 22. The output of the bitervi decoder 22 is interleaved so that it is re-constructed into such a frame as shown in FIG. 3. From the thus re-constructed frame, system data are separated by the first demultiplexer 22, and an error of the frame in units of a block in a horizontal direction is corrected by the Reed-Solomon decoder 23 using a Reed-Solomon code added on the transmission side.

The digital data whose error has been corrected by the Reed-Solomon decoder 23 are applied to the second demultiplexer 24, by which scramble control data are separated from the digital data and applied to the descramble controller 26. Consequently, the descramble controller 26 applies the descramble control data to the descrambler 25 which has generated a descrambling train. Scrambled digital data are applied to the descrambler 25 and are descrambled with the descrambling train, and the thus descrambled digital data are supplied to the third demultiplexer 28.

The descrambled digital data are thus demultiplexed into video data, audio data and preliminary data by the third demultiplexer 28. The video data and the audio data are decoded by the decoders 29 and 30, respectively, to obtain original data. It is to be noted that a PN (Pseudo Noise) train is generally used as the scrambling train to be used by a scrambler in order to allow conditional accessing.

The construction of a frame for multiplexing is not limited to the specific one shown in FIG. 3 but may be set flexibly in accordance with an available transmission band width and the rate of convolution codes. Subsequently, several frame constructions when the transmission rate is changed will be described with reference to FIGS. 4 to 6.

Figure 4:
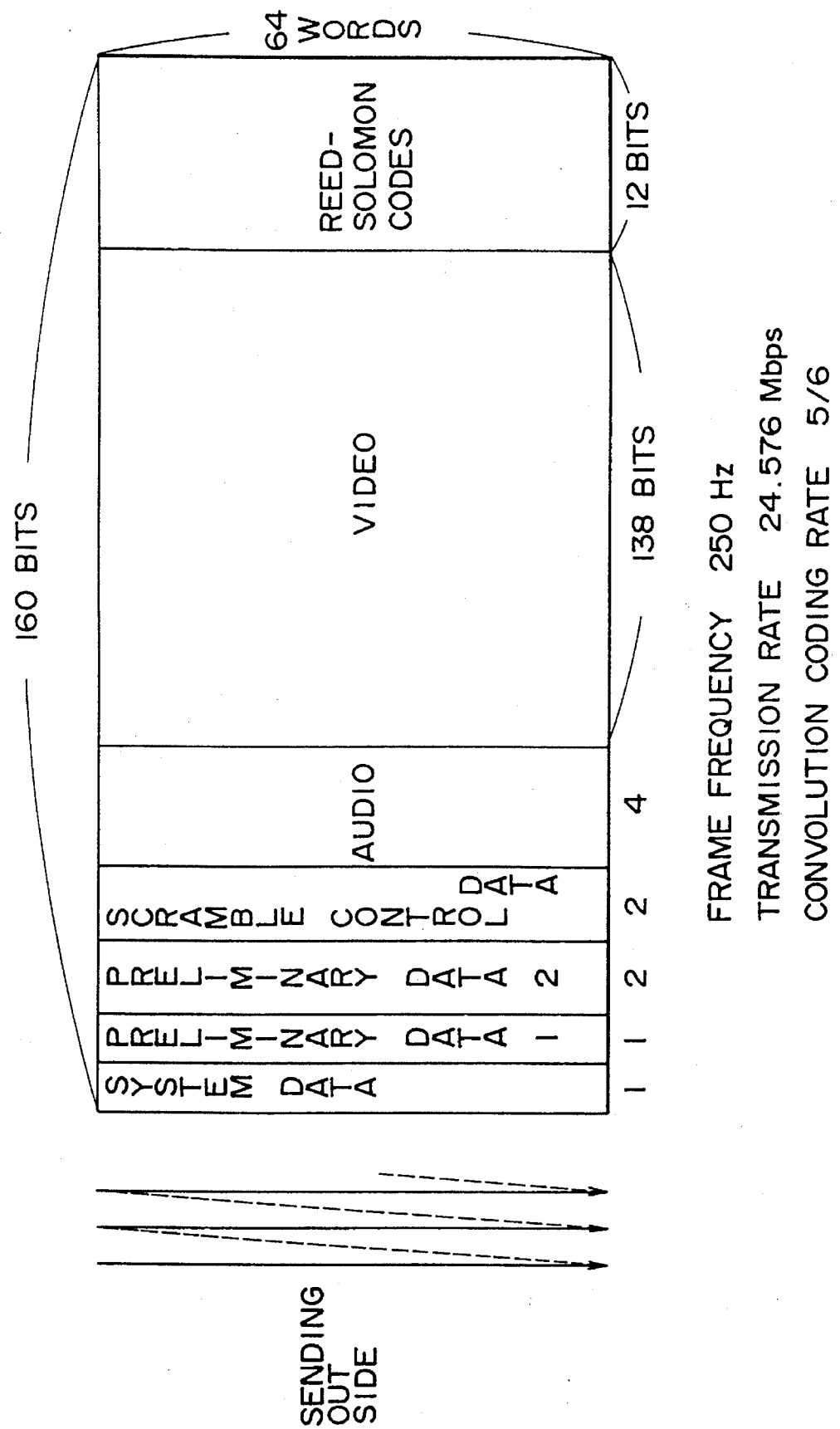

FIG. 4 shows a frame construction when convolution coding of the rate of ⅚ is performed for data of the information rate of 20.48 Mbps to obtain the transmission rate of 24,576 Mbps while the frame frequency of 250 Hz is used. The frame is constituted from 160 bits in a horizontal direction and 64 words in a vertical direction, and a region of 1×64 words is allocated to the system data; another region of 1×64 words is allocated to the preliminary data 1; a further region of 2×64 words is allocated to the preliminary data 2; a still further region of 2×64 words is allocated to the scramble control data; a yet further region of 4×64 words is allocated to the audio data; a yet further region of 138×64 words is allocated to the video data; and a yet further region of 12×64 words is allocated to the Reed-Solomon codes.

As a result, the rates of the data are defined as given below:

| | |
|---|---|
| video data | 17.664 Mbps |
| audio data | 512 kbps |
| preliminary data 1 | 128 kbps |
| preliminary data 2 | 256 kbps |
| scramble control data | 256 kbps |
| system data | 128 kbps |
| Reed-Solomon codes | 1.536 Mbps |

With the frame construction shown in FIG. 4, a drop of the transmission rate is absorbed principally by reduction of the rate of video data.

Figure 5:
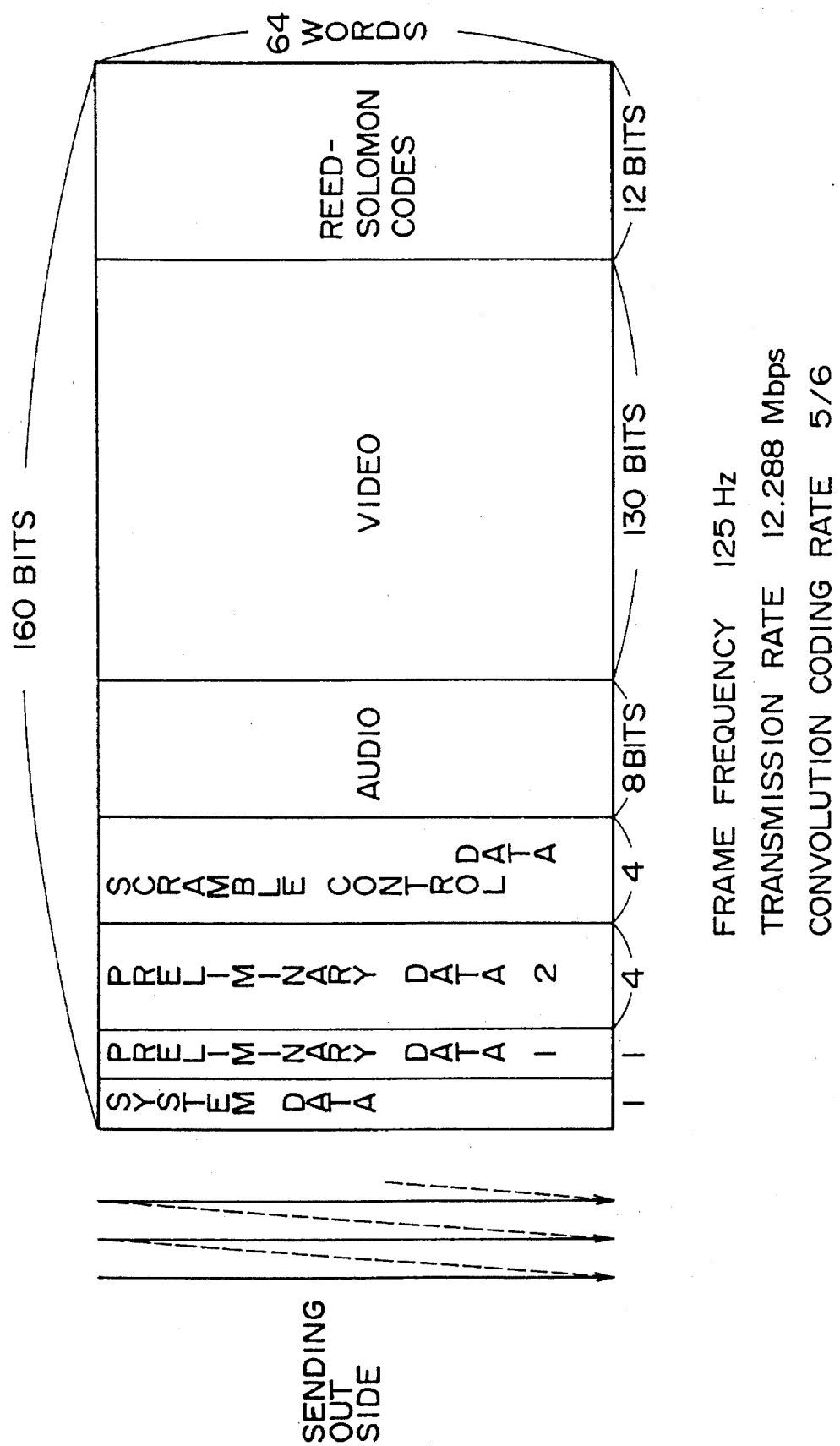

FIG. 5 shows a frame construction when convolution coding of the rate of ⅚ is performed for data of the information rate of 10.24 Mbps to obtain the transmission rate of 12.288 Mbps while the frame frequency of 125 Hz is used. The frame is constituted from 160 bits in a horizontal direction and 64 words in a vertical direction, and a region of 1×64 words is allocated to the system data; another region of 1×64 words is allocated to the preliminary data 1; a further region of 4×64 words is allocated to the preliminary data 2; a still further region of 4×64 words is allocated to the scramble control data; a yet further region of 8×64 words is allocated to the audio data; a yet further region of 130×64 words is allocated to the video data; and a yet further region of 12×64 words is allocated to the Reed-Solomon codes.

As a result, the rates of the data are defined as given below:

| | |
|---|---|
| video data | 8.832 Mbps |
| audio data | 512 kbps |
| preliminary data 1 | 64 kbps |
| preliminary data 2 | 256 kbps |
| scramble control data | 256 kbps |
| system data | 64 kbps |
| Reed-Solomon codes | 768 kbps |

Figure 6:
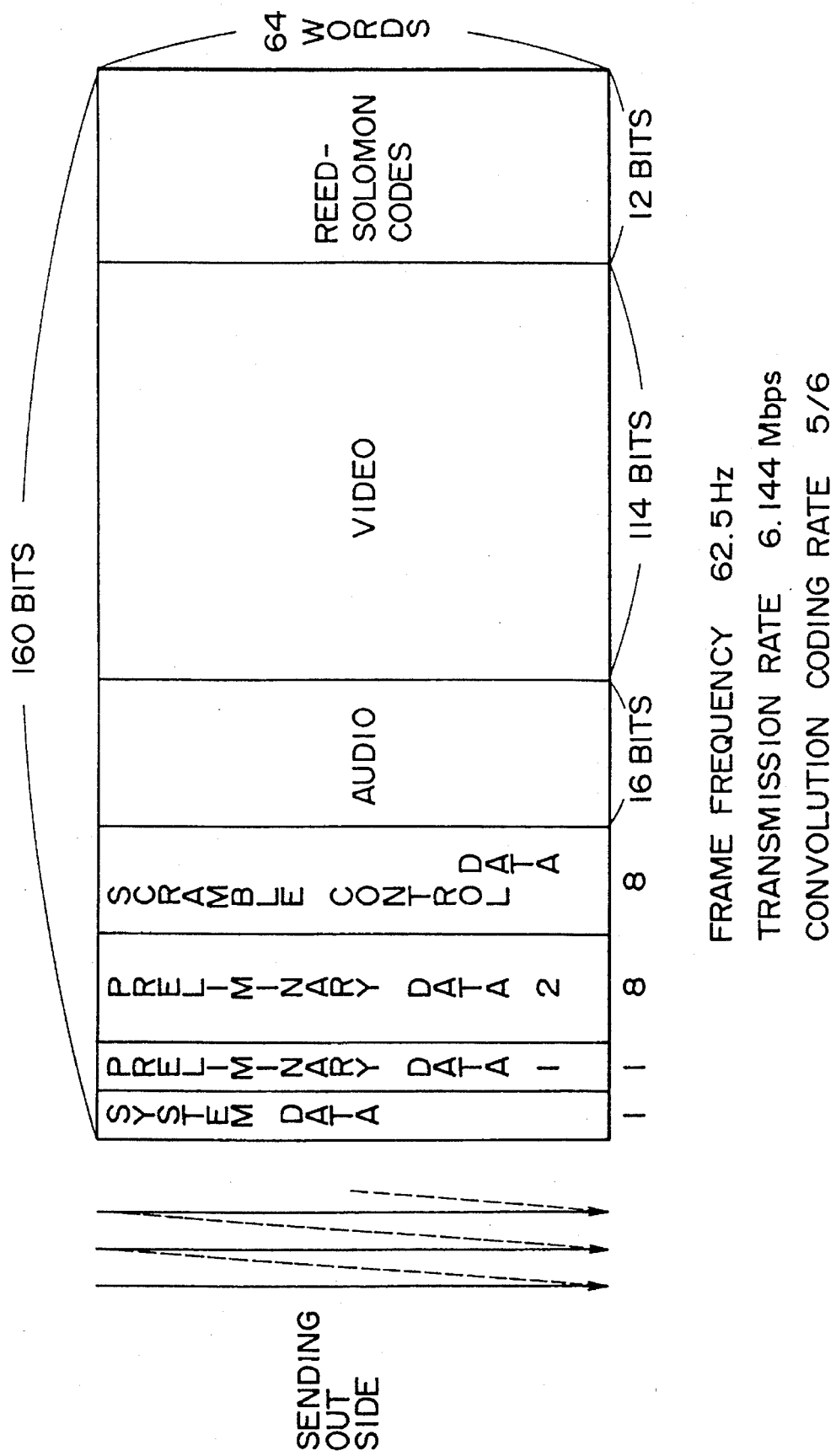

FIG. 6 shows a frame construction when convolution coding of the rate of ⅚ is performed for data of the information rate of 5.12 Mbps to obtain the transmission rate of 6,144 Mbps while the frame frequency of 62.5 Hz is used. The frame is constituted from 160 bits in a horizontal direction and 64 words in a vertical direction, and a region of 1×64 words is allocated to the system data; another region of 1×64 words is allocated to the preliminary data 1; a further region of 8×64 words is allocated to the preliminary data 2; a still further region of 8×64 words is allocated to the scramble control data; a yet further region of 16×64 words is allocated to the audio data; a yet further region of 114×64 words is allocated to the video data; and a yet further region of 12×64 words is allocated to the Reed-Solomon codes.

As a result, the rates of the data are defined as given below:

| | |
|---|---|
| video data | 3.648 Mbps |
| audio data | 512 kbps |
| preliminary data 1 | 32 kbps |
| preliminary data 2 | 256 kbps |
| scramble control data | 256 kbps |
| system data | 32 kbps |
| Reed-Solomon codes | 384 kbps |

The frame constructions described above with reference to FIGS. 3 to 6 cope with reduction of the transmission rate by reduction of the rate of the video data as the transmission rate decreases. When the rate of the video data is decreased as the transmission rate decreases in this manner, an image of a high definition television system or of a high quality cannot be transmitted, but an image of a motion picture or movie which involves slow motion can be transmitted sufficiently.

Subsequently, several frame constructions when the rate of the convolution codes is changed will be described with reference to FIGS. 7 to 10. FIG. 7 shows a frame construction when convolution coding of the rate of ⅞ is performed for data of the information rate of 10,752 Mbps to obtain the transmission rate of 12.288 Mbps while the frame frequency of 125 Hz is used. The frame is constituted from 168 bits in a horizontal direction and 64 words in a vertical direction, and a region of 1×64 words is allocated to the system data; another region of 1×64 words is allocated to the preliminary data 1; a further region of 4×64 words is allocated to the preliminary data 2; a still further region of 4×64 words is allocated to the scramble control data; a yet further region of 8×64 words is allocated to the audio data; a yet further region of 138×64 words is allocated to the video data; and a yet further region of 12×64 words is allocated to the Reed-Solomon codes.

As a result, the rates of the data are defined as given below:

| | |
|---|---|
| video data | 8.832 Mbps |
| audio data | 512 kbps |
| preliminary data 1 | 64 kbps |
| preliminary data 2 | 256 kbps |
| scramble control data | 256 kbps |
| system data | 64 kbps |
| Reed-Solomon codes | 768 Mbps |

FIG. 8 shows a frame construction when convolution coding of the rate of ¾ is performed for data of the information rate of 9.216 Mbps to obtain the transmission rate of 12.288 Mbps while the frame frequency of 125 Hz is used. The frame is constituted from 144 bits in a horizontal direction and 64 words in a vertical direction, and a region of 1×64 words is allocated to the system data; another region of 1×64 words is allocated to the preliminary data 1; a further region of 4×64 words is allocated to the preliminary data 2; a still further region of 4×64 words is allocated to the scramble control data; a yet further region of 8×64 words is allocated to the audio data; a yet further region of 116×64 words is allocated to the video data; and a yet further region of 12×64 words is allocated to the Reed-Solomon codes.

As a result, the rates of the data are defined as given below:

| | |
|---|---|
| video data | 7.424 Mbps |
| audio data | 512 kbps |
| preliminary data 1 | 64 kbps |
| preliminary data 2 | 256 kbps |
| scramble control data | 256 kbps |
| system data | 64 kbps |
| Reed-Solomon codes | 768 Mbps |

FIG. 9 shows a frame construction when convolution coding of the rate of ⅔ is performed for data of the information rate of 8.192 Mbps to obtain the transmission rate of 12.288 Mbps while the frame frequency of 125 Hz is used. The frame is constituted from 128 bits in a horizontal direction and 64 words in a vertical direction, and a region of 1×64 words is allocated to the system data; another region of 1×64 words is allocated to the preliminary data 1; a further region of 4×64 words is allocated to the preliminary data 2; a still further region of 4×64 words is allocated to the scramble control data; a yet further region of 8×64 words is allocated to the audio data; a yet further region of 98×64 words is allocated to the video data; and a yet further region of 12×64 words is allocated to the Reed-Solomon codes.

As a result, the rates of the data are defined as given below:

| | |
|---|---|
| video data | 6.272 Mbps |
| audio data | 512 kbps |
| preliminary data 1 | 64 kbps |
| preliminary data 2 | 256 kbps |
| scramble control data | 256 kbps |
| system data | 64 kbps |
| Reed-Solomon codes | 768 Mbps |

FIG. 10 shows a frame construction when convolution coding of the rate of ½ is performed for data of the information rate of 6.144 Mbps to obtain the transmission rate of 12.288 Mbps while the frame frequency of 125 Hz is used. The frame is constituted from 96 bits in a horizontal direction and 64 words in a vertical direction, and a region of 1×64 words is allocated to the system data; another region of 1×64 words is allocated to the preliminary data 1; a further region of 4×64 words is allocated to the preliminary data 2; a still further region of 4×64 words is allocated to the scramble control data; a yet further region of 8×64 words is allocated to the audio data; a yet further region of 66×64 words is allocated to the video data; and a yet further region of 12×64 words is allocated to the Reed-Solomon codes.

As a result, the rates of the data are defined as given below:

| | |
|---|---|
| video data | 4.224 Mbps |
| audio data | 512 kbps |
| preliminary data 1 | 64 kbps |
| preliminary data 2 | 256 kbps |
| scramble control data | 256 kbps |
| system data | 64 kbps |
| Reed-Solomon codes | 768 Mbps |

FIG. 11 shows a table indicating the corresponding relationship among the information rate, the frame frequency and the horizontal size of a frame which are changed when the transmission rate is changed over among the four stages and the rate of the convolution codes is changed over among the five stages as described above. Referring to FIG. 11, the band width is a band width allocated to transmission of digital multiplexed data from within a transmission band possessed by the transmission apparatus of the artificial satellite or the like, and the transmission rate is determined in response to the band width. While the information rate is also determined from the transmission rate, in the present invention, the information rate is determined from the rate of the convolution coding and the transmission rate.

Consequently, even when the transmission rate is fixed, the following operation can be achieved by changing the rate of the convolution coding. When the quality of the transmission line is deteriorated, the rate of the convolution coding is changed so as to decrease thereby increasing the redundancy to increase the error correction faculty to achieve regular reception. On the other hand, when the quality of the transmission line is high, the rate of the convolution coding is changed so as to increase thereby raising the information rate so that a large amount of data can be transmitted at a high rate.

In the case of, for example, a motion picture or movie, data are transmitted at the information rate of 4 Mbps to 5 Mbps, but in the case of ordinary television, data are transmitted using the information rate of 10 Mbps or so, and when a television image of a high quality is required, data are transmitted using the information rate of 20 Mbps or so. Further, in the case of a high definition television image, the information rate of 30 Mbps to 40 Mbps is selected to transmit data.

Subsequently, a different frame construction according to the present invention will be described with reference to FIGS. 12(a) and 12(b). The frame construction shown is different from the frame constructions described hereinabove in that video data and audio data make up packets to be transmitted. In particular, while the present frame construction is similar to the frame constructions described hereinabove in that regions are allocated in vertical columns to system data, preliminary data 1, preliminary data 2, scramble control data and Reed-Solomon codes, it is different in that the region allocated to video data and audio data is formed as packets of video data and audio data.

Figure 12A:
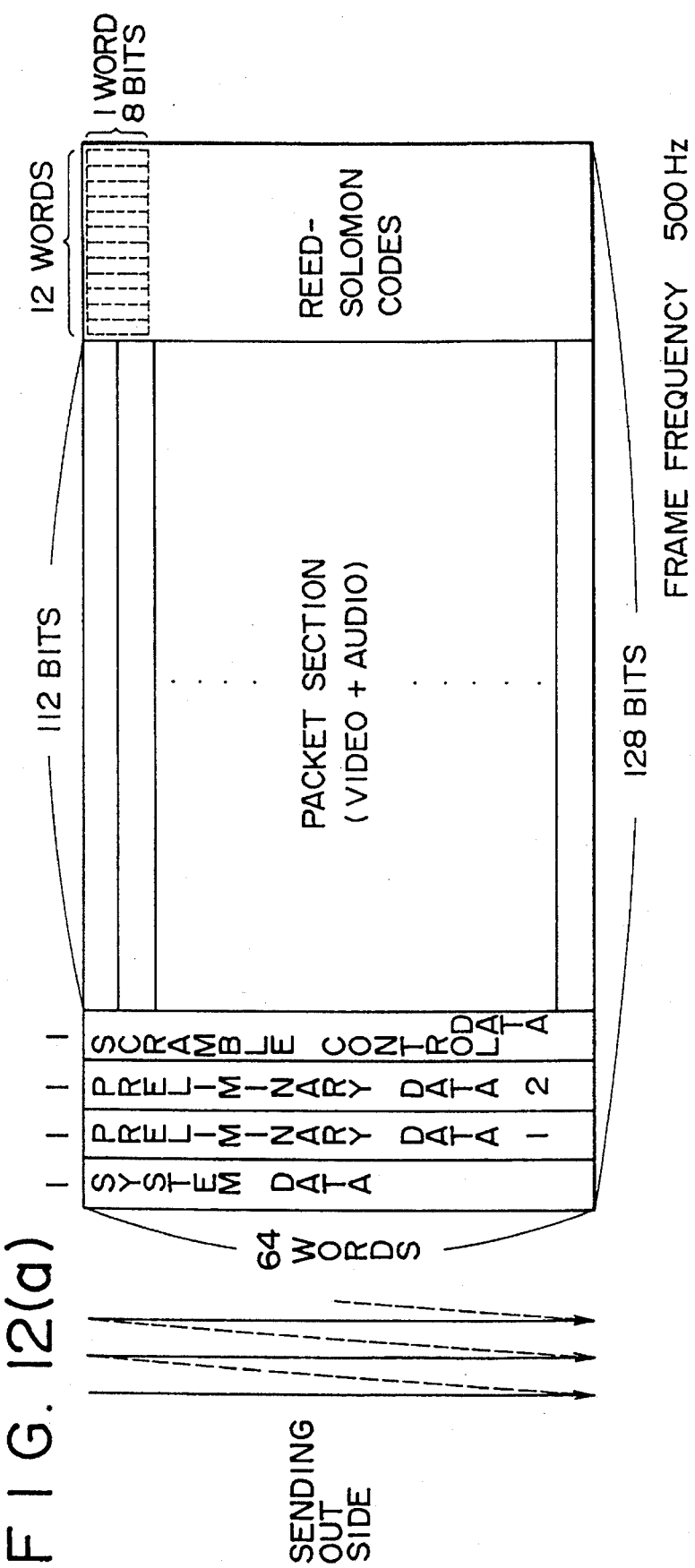
FIGS. 12(a) and 12(b) are diagrammatic views illustrating a different frame construction which may be employed in the digital multiplex transmission system of the present invention and which uses a packet.

FIG. 12(a) shows the construction of a frame when the information rate is 32.768 Mbps; the transmission rate is 40.96 Mbps at the rate of convolution coding of ⅘ and is 49.152 Mbps at the rate of convolution coding of ⅔; and the frame frequency is 500 Hz. FIG. 12(b) shows the construction of the packets constituting the packet section. The frame is constituted from 128 bits in a horizontal direction and 64 words in a vertical direction, and a region of 1×64 words is allocated to the system data; another region of 1×64 words is allocated to the preliminary data 1; a further region of 1×64 words is allocated to the preliminary data 2; a still further region of 1×64 words is allocated to the scramble control data; a yet further region of 12×64 words is allocated to the packet section of audio data and video data; and a yet further region of 12×64 words is allocated to the Reed-Solomon codes.

As a result, the rates of the data are defined as given below:

| | |
|---|---|
| video data | 28.672 Mbps |
| audio data | 256 kbps |
| preliminary data 1 | 256 kbps |
| preliminary data 2 | 256 kbps |
| scramble control data | 256 kbps |
| system data | 256 kbps |
| Reed-Solomon codes | 3.072 Mbps |

Figure 12B:
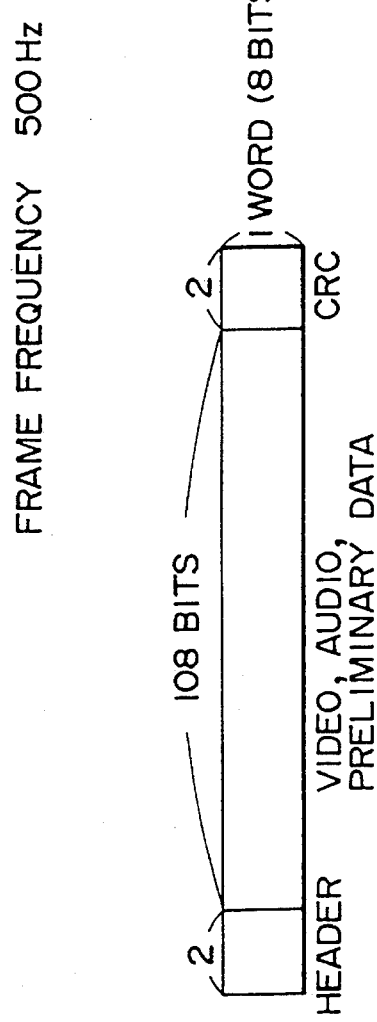
Figure 13:
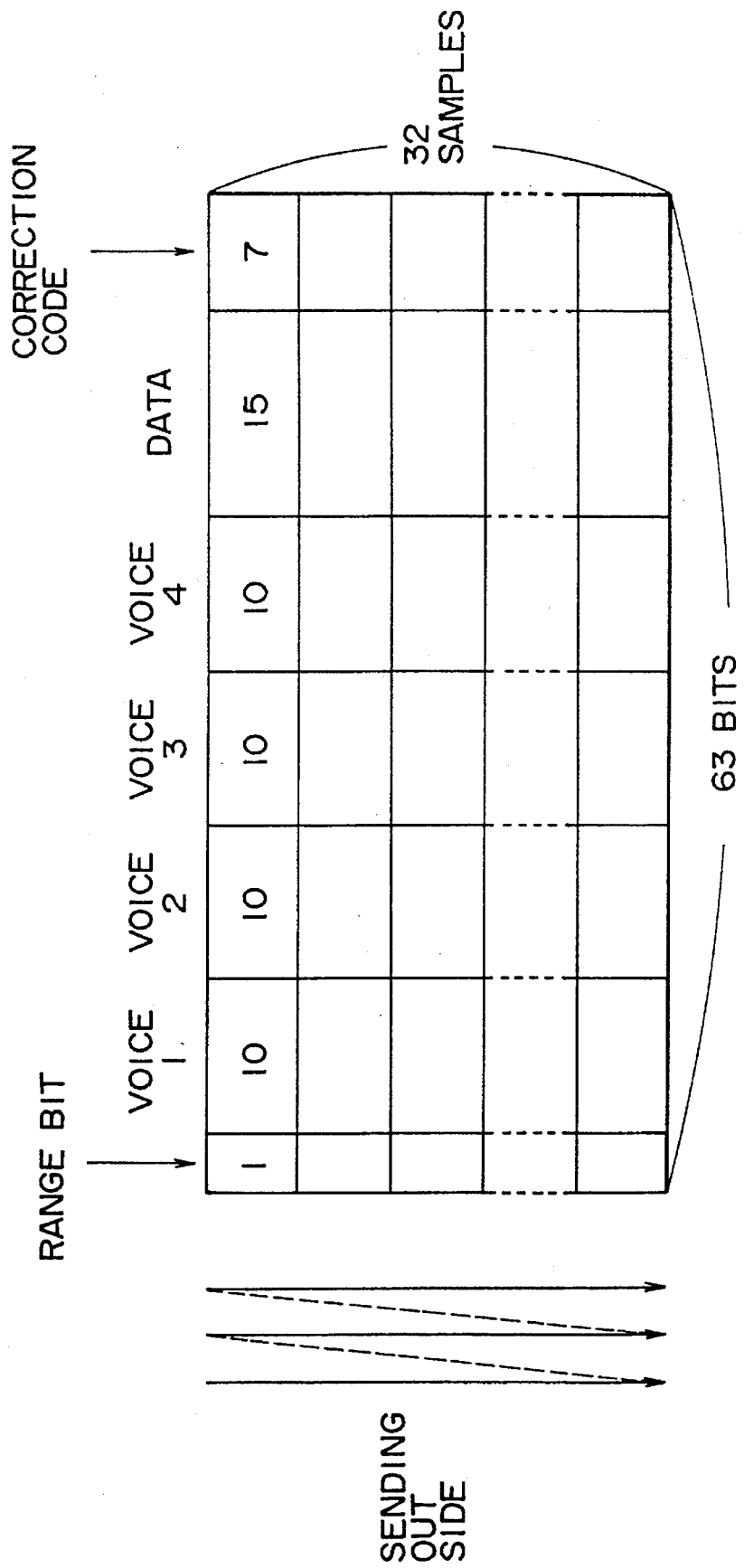
FIG. 13 is a diagrammatic view showing a frame for digital multiplex transmission of voices.

Meanwhile, one packet is constituted, as seen in FIG. 12(b), from 112 words each including 8 bits arranged in a vertical column. At the top of the packet, a header is positioned and represents what kind of data are included in the packet and information of multiplexing or the like. Subsequent to the header, packeted data of video data or audio data or the like are positioned, and at the terminal end of the packet, a CRC (Cyclic Redundancy Check) code for detecting an error is positioned. The header is constituted from 2 words; the data are constituted from 108 words; and the CRC code is constituted from 2 words.

A total of 64 packets of such construction as described above are arranged vertically to make up the packet section shown in FIG. 12(a). With the packet construction, since video data or audio data can be transmitted selectively depending upon a flag of the header, the number of multiplexing channels of video data or audio data in the packet section can be set arbitrarily to construct the packet section. Consequently, such channel multiplexing transmission can be performed that, for example, instead of sending video data of a high information rate by way of 2 channels, video data of a low information rate are sent by way of 3 channels.

Meanwhile, if scramble control data are also transmitted using a packet, on/off control of scrambling or control of changing over between or among a plurality of scrambling trains can be performed in units of a packet, and consequently, cancellation of scrambling or unauthorized decoding of a particular channel can be prevented. While an example of a frame which employs a packet is shown in FIGS. 12(a) and 12(b), the size or any other parameter of a frame is not limited to that of the specific example and may be varied suitably in accordance with the transmission rate or some other parameter. Further, the length of the header of a packet is not limited to 2 words, and the CRC code may be omitted if possible. Also the size of a packet is not limited to that shown in FIG. 12(b).

It is to be noted that the inspection word number may be increased in order to raise the correction faculty for Reed-Solomon codes. Further, in order to transmit a greater amount of information, the inspection word number of Reed-Solomon codes may be set to a value lower than 12, and the number of preliminary data or the information amount of audio data may be increased or decreased suitably.

Having now fully described the invention, it will be apparent to one of ordinary skill in the art that many changes and modifications can be made thereto without departing from the spirit and scope of the invention as set forth herein.

What is claimed is:

1. A digital multiplex transmission system, comprising:
   first multiplexer means for multiplexing at least digital audio data and digital video data and scrambling resultant multiplexed data with a scrambling train;
   second multiplexer means for multiplexing scrambled data from said first multiplexer means, scramble control data and system data, and allocating resultant scrambled multiplexed data on a two-dimensional frame;
   means for coding the frame in units of a block in a horizontal direction by Reed-Solomon coding to add Reed-Solomon codes to the frame, the frame having respective regions for the video data, the audio data, the scramble control data, the system data and the Reed-Solomon codes, and each pair of adjacent regions having a boundary therebetween which is a vertical straight line; and
   means for adding the system data including a frame synchronizing signal to the two-dimensional frame, coding resultant data by convolution coding to obtain digital multiplexed data and transmitting the digital multiplexed data.

2. A digital multiplex transmission system according to claim 1, further comprising means for changing over a redundancy of the convolution codes among ⅞, ⅚, ¾, ⅔ and ½, and means operable upon changing over of the redundancy of the convolution codes for changing an allocation width of video data in the two-dimensional frame in response to a new redundancy value so that the digital multiplexed data may be transmitted at a fixed transmission rate.

3. A digital multiplexer transmission system according to claim 2, further comprising means for changing over the transmission rate in response to a transmission bandwidth.

4. A digital multiplex transmission system, comprising:
   first multiplexer means for multiplexing at least digital audio data and digital video data and scrambling resultant multiplexed data with a scrambling train;
   second multiplexer means for multiplexing scrambled data from said first multiplexer means, scramble control data and system data, and allocating resultant multiplexed scrambled data on a two-dimensional frame and coding the frame in units of a block in a horizontal direction by Reed-Solomon coding to add Reed-Solomon codes to the frame;
   means for adding the system data including a frame synchronizing signal to the two-dimensional frame, coding resultant data by convolution coding to obtain digital multiplexed data and transmitting the digital multiplexed data; and
   allocating means including means for forming packets of the digital audio data and the digital video data, for allocating the system data including the frame synchronizing signal, the scramble control data, packets including the digital audio data and the digital video data, and the Reed-Solomon codes on the two-dimensional frame, the frame having respective regions for the video data, the audio data, the scramble control data, the system data and the Reed-Solomon codes, and each pair of adjacent regions having a boundary therebetween which is a vertical straight line.

5. A digital multiplex transmission system according to claim 4, wherein the packets include the scramble control data as well as the audio data and the video data, and said allocating means allocates the system data including the frame synchronizing signal, the packets including the scramble control data as well as the audio data and the video data, and the Reed-Solomon codes on the two-dimensional frame.

6. A digital multiplex transmission system according to claim 5, further comprising means for changing over a redundancy of the convolution code among ⅞, ⅚, ¾, ⅔ and ½, and means operable upon changing over of the redundancy of the convolution codes for changing an allocation width of the packets in response to a new redundancy value so that the digital multiplexed data may be transmitted at a fixed transmission rate.

7. An encoder for a digital multiplex transmission system, comprising:

a first multiplexer for multiplexing at least digital audio data and digital video data;

a second multiplexer for scrambling the data multiplexed by said first multiplexer with a scrambling train, multiplexing the scrambled data and scramble control data, and allocating the scrambled data and the scramble control data on a two-dimensional frame;

a Reed-Solomon coder for coding the frame multiplexed by said second multiplexer in units of a block in a horizontal direction by Reed-Solomon coding to add Reed-Solomon codes to the frame;

a third multiplexer for adding system data to the frame to which the Reed-Solomon codes have been added, the frame having respective regions for the video data, the audio data, the scramble control data, the system data and the Reed-Solomon codes, and each pair of adjacent regions having a boundary therebetween which is a vertical straight line;

a convolution coder for coding the data of the frame outputted from said third multiplexer by convolution coding; and a phase shift keying modulator for modulating the data convolution coded by said convolution coder by phase shift keying modulation and transmitting the modulated data.

8. An encoder according to claim 7, wherein said second multiplexer allocates the scramble control data, the audio data, the video data the Reed-Solomon codes and the system data to the two-dimensional frame.

9. An encoder according to claim 7, wherein the system data includes a frame synchronizing signal, said second multiplexer includes means for forming packets of the scramble control data, the audio data and the video data, and said second multiplexer, said Reed-Solomon coder and said third multiplexer allocate the packets including the scramble control data as well as the audio data and the video data, the Reed-Solomon codes, and the system data including the frame, synchronizing signal, respectively, on the two-dimensional frame.

10. A digital multiplex transmission system, comprising:

means for multiplexing at least digital audio data and digital video data and scrambling the multiplexed data with a scrambling train;

means for multiplexing the scrambled data with scramble control data, allocating video data, audio data and the scramble control data on a two-dimensional frame and coding the frame in units of a block in a horizontal direction by Reed-Solomon codes to the frame;

means for adding system data to the two-dimensional frame, processing the resultant data by convolution coding and phase shift keying modulation to obtain encoded data and transmitting the encoded data, the frame having respective regions for the video data, the audio data, the scramble control data, the system data and the Reed-Solomon codes, and each pair of adjacent regions having a boundary therebetween which is a vertical straight line;

means for demodulating the transmitted digital data multiplexed in a two-dimensional frame by phase shift keying demodulation, decoding the demodulated data by bitervi decoding to correct an error of the convolution coded digital multiplexed data, and correcting an error of the frame in units of a block in a horizontal direction using one of the Reed-Solomon codes added to the frame;

means for separating the scramble control data from the multiplexed data after the error correction and descrambling the multiplexed data with the separated scramble control data; and means for demultiplexing the descrambled multiplexed data into video data, audio data and preliminary data.

11. A decoder for a digital multiplex transmission system, comprising:

a bitervi decoder for decoding convolution codes by bitervi decoding;

a Reed-Solomon decoder for correcting an error of the thus bitervi decoded multiplexed data in units of a block in a horizontal direction using Reed-Solomon codes added to the multiplexed data;

a descrambler for separating scramble control data from the multiplexed data after the error correction and descrambling the multiplexed data with the thus separated scramble control data; and a demultiplexer for demultiplexing the descrambled multiplexed data at least into video data and audio data.

\* \* \* \* \*

UNITED STATES PATENT AND TRADEMARK OFFICE
CERTIFICATE OF CORRECTION

PATENT NO. : 5,506,903
DATED : April 9, 1996
INVENTOR(S) : Masami Yamashita

It is certified that error appears in the above-identified patent and that said Letters Patent is hereby corrected as shown below:

Col.3, line 24, change "0n" to --On--
Col.4, line 43, change "49,152" to --49.152--
Col.5, line 38, delete "to"
Col.6, line 1, change "49,152" to --49.152--
Col.7, line 14, change "24,576" to --24.576--
     line 65, change "5/6is" to --5/6 is--
     line 67, change "6,144" to --6.144--
Col.8, line 35, change "10,752" to --10.752--

Col.13, line 47, delete "," first occurrence.

Signed and Sealed this

Tenth Day of February, 1998

Attest:

BRUCE LEHMAN

Attesting Officer     Commissioner of Patents and Trademarks